(12) United States Patent
Morimoto

(10) Patent No.: US 7,592,774 B2
(45) Date of Patent: Sep. 22, 2009

(54) VOLTAGE MEASUREMENT APPARATUS AND ELECTRICALLY-DRIVEN TOOL

(75) Inventor: Naohisa Morimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 447 days.

(21) Appl. No.: 11/498,127

(22) Filed: Aug. 3, 2006

(65) Prior Publication Data

US 2007/0029967 A1    Feb. 8, 2007

(30) Foreign Application Priority Data

Aug. 3, 2005    (JP)    ............... 2005-225736

(51) Int. Cl.
*H02J 7/00*    (2006.01)
*G01N 27/416*    (2006.01)

(52) U.S. Cl. .................... 320/116; 324/426; 324/434

(58) Field of Classification Search ................. 324/426, 324/434; 320/116
See application file for complete search history.

(56) References Cited

U.S. PATENT DOCUMENTS 6,639,408 B2 * 10/2003 Yudahira et al. ............ 324/434

FOREIGN PATENT DOCUMENTS

JP    2001-201522    7/2001

\* cited by examiner

*Primary Examiner*—Akm E Ullah
*Assistant Examiner*—Ramy Ramadan
(74) *Attorney, Agent, or Firm*—McDermott Will & Emery LLP

(57) ABSTRACT

A voltage measurement apparatus is provided in which: among battery cells which make up a battery-cell group, a sampling switch electrically connects any one or more battery cells targeted for measurement to a capacitor so that the capacitor is charged by these battery cells; a measurement section acquires the voltage of the charged capacitor as a measurement voltage and corrects the measurement voltage so that the voltage error in the measurement voltage caused by the inter-terminal capacitance of the sampling switch can be narrowed; and an over-voltage prevention switch turns on immediately before the sampling switch is turned on and grounds the input terminal of the measurement section so that the measurement section can be protected from an over-voltage.

11 Claims, 9 Drawing Sheets

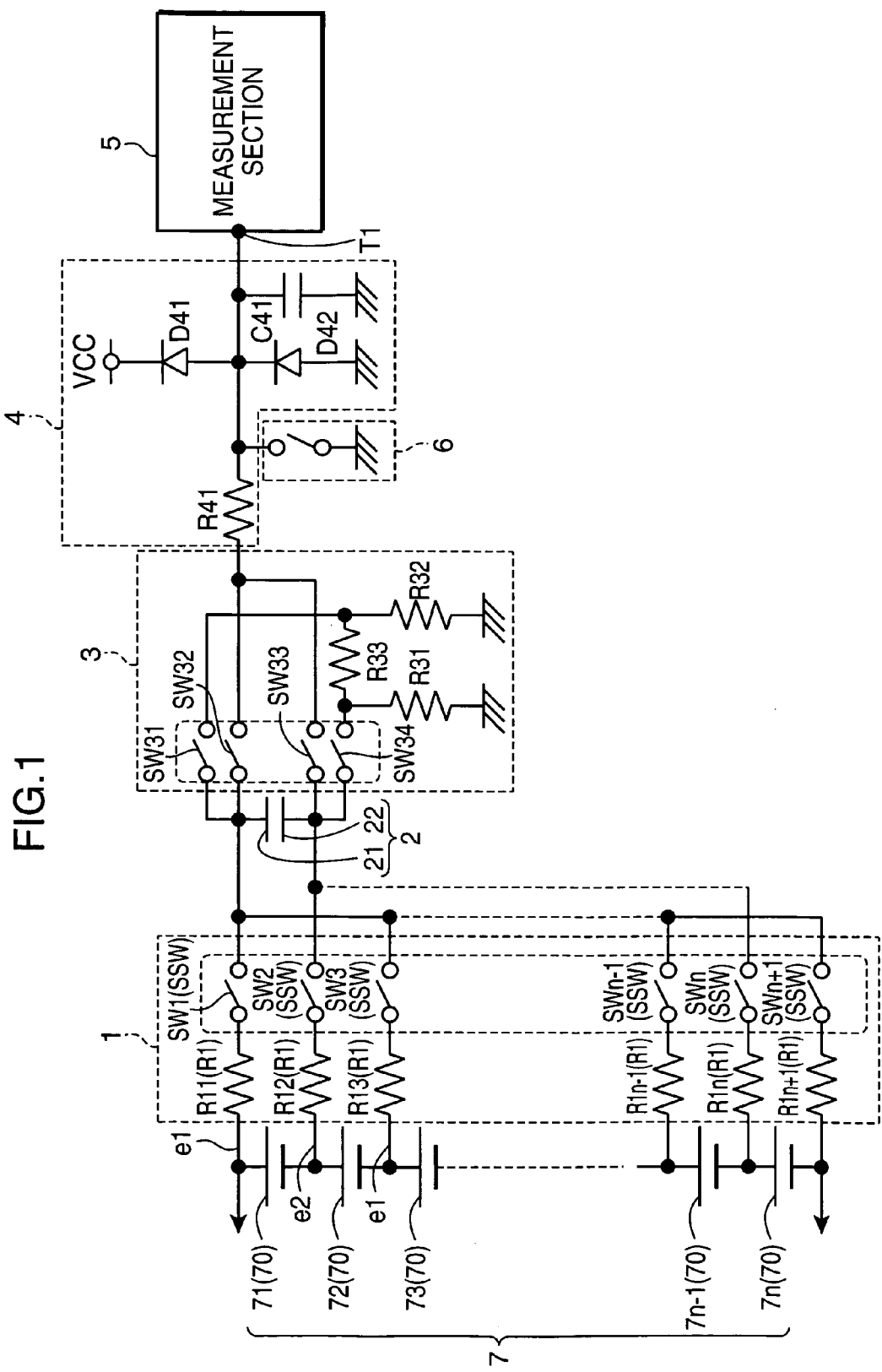

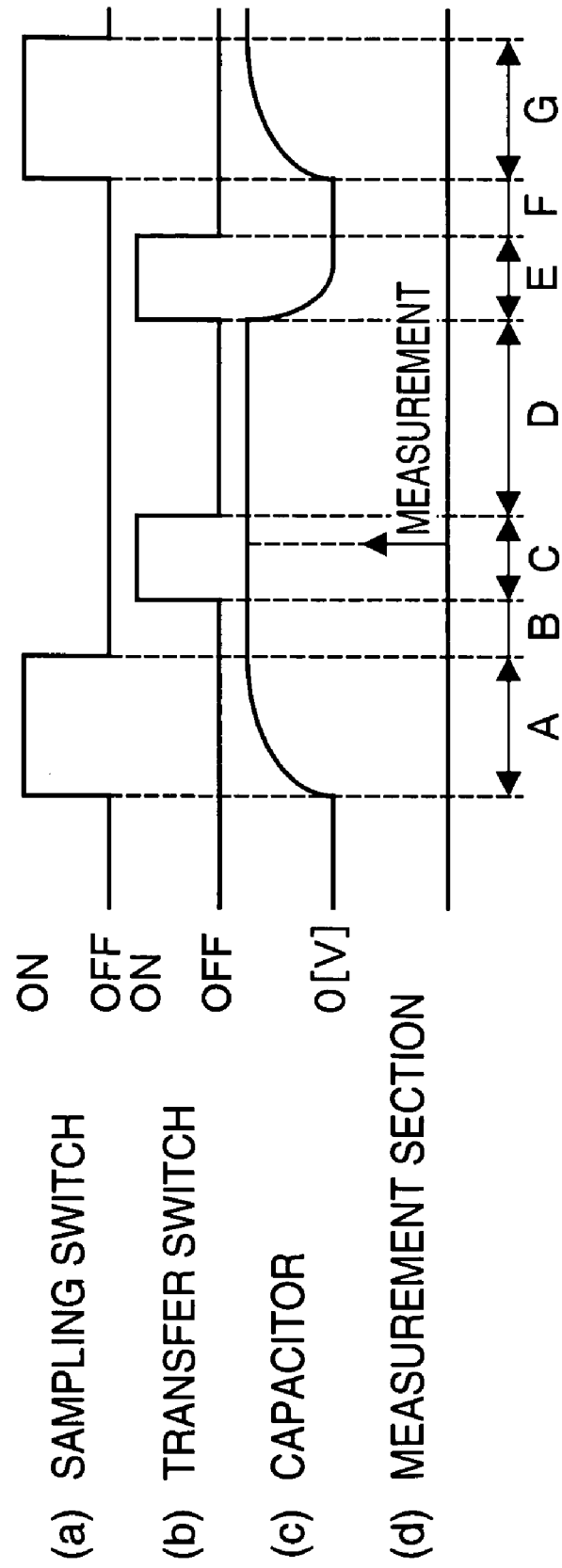

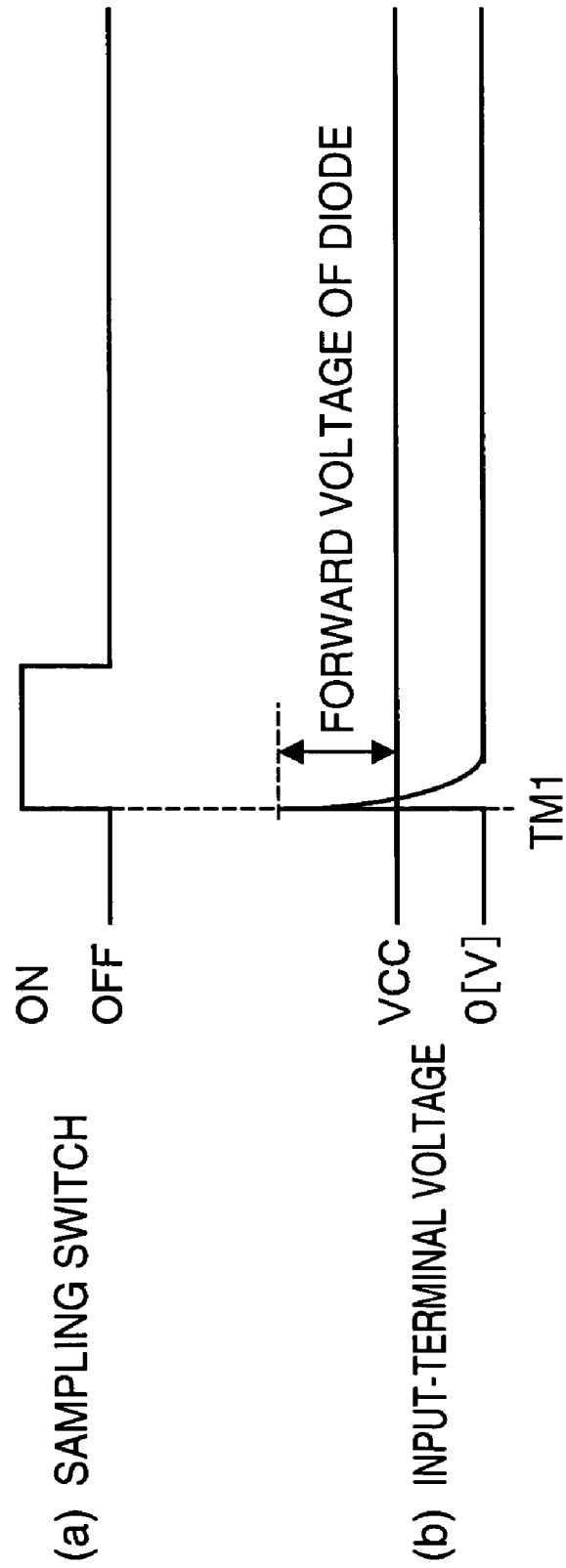

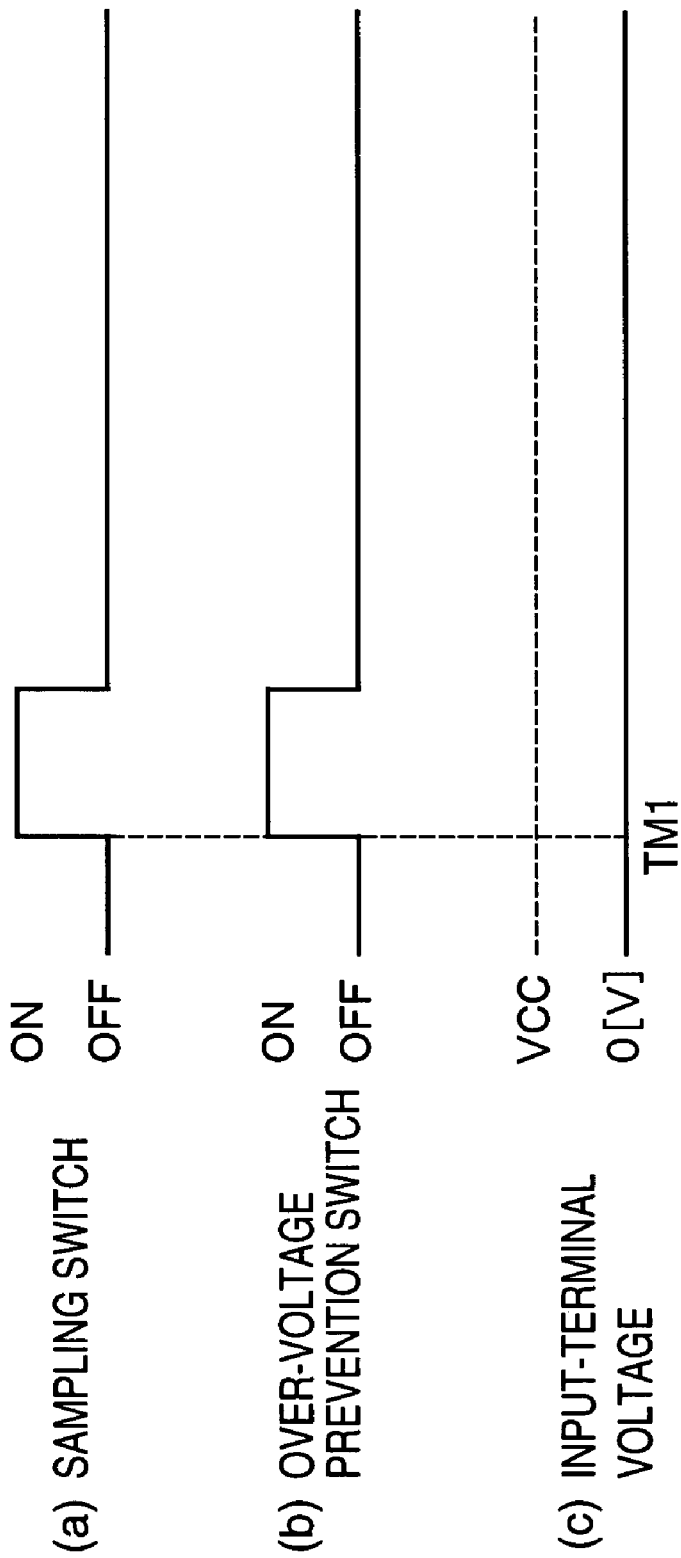

VOLTAGE MEASUREMENT APPARATUS AND ELECTRICALLY-DRIVEN TOOL

BACKGROUND OF THE INVENTION

1. Field of the Invention

The present invention relates to a voltage measurement apparatus which measures the voltage of a battery-cell group that is made up of a plurality of battery cells connected in series.

2. Description of the Background Art

In recent years, in an electric car, a hybrid car, an electrically-driven tool or the like, an electrically-driven motor has been widely used as a mechanical power source or an auxiliary mechanical power source. As a power supply source to an electrically-driven motor, a battery-cell group formed by a secondary battery has been popular which is made up of a plurality of battery cells connected in series. For example, as such a battery-cell group, there is a 1.2-volt nickel-hydrogen battery, and a battery-cell group formed by connecting 240 cells in series is well known. In this battery-cell group, each battery cell has various temperature characteristics or capacitances. Hence, in the process of a charge or a discharge, an overcharge or an over-discharge may be generated in some cells. In order to prevent such an overcharge or over-discharge, it is essential to measure not only the voltage of a battery-cell group as a whole, but also the voltage of individual battery cells or each battery-cell block made up of a predetermined number of cells.

As a prior art of measuring the voltage of each battery cell which makes up a battery-cell group, for example, a flying capacitor circuit is known which is described in Japanese Patent Laid-Open No. 2001-201522 specification. FIG. 9 is a circuit diagram, showing the configuration of the flying capacitor circuit according to the prior art. As shown in FIG. 9, this flying capacitor circuit includes: a battery-cell group 100 which is formed by connecting N battery cells in series; cell-selection switch groups 200, 300 which choose any battery cell from the battery-cell group 100; a sampling switch 400; a transfer switch 600; an A/D converter 700.

A basic operation of the flying capacitor circuit will be described using FIG. 9. Specifically, the cell-selection switch groups 200, 300 choose any battery cell included in the battery-cell group 100. Then, the sampling switch 400 operates so that a capacitor 500 is charged by the chosen battery cell. After it has been charged, the sampling switch 400 is turned off and the transfer switch 600 is turned on. Thereby, the voltage of the charged capacitor 500 is transformed into a digital value by the A/D converter 700. Consequently, the chosen cell's voltage can be obtained by the sampling switch 400.

Herein, an electric switch is each used as the above described cell-selection switch groups 200, 300, sampling switch 400 and transfer switch 600. This electric switch is sure to have a parasitic capacitance. Hence, when the capacitor 500 is charged by any battery cell, the parasitic capacitance affects the capacitor 500 and produces a voltage error in a measurement voltage which is the voltage of the capacitor 500 after charged. According to the prior art, a disadvantage arises in that among such parasitic capacitances, a ground capacitance Cs may generate a voltage error. This voltage error $\Delta V$ is given in the following expression (B).

$$\Delta V = \Sigma C s / C \times V(n-1) \quad (B)$$

Herein, reference character Cs denotes a ground capacitance, and $\Sigma Cs$ designates the sum total of (N+1) ground capacitances in all which are connected to the upper electrode of the capacitor 500. According to the prior art, the sampling switch 400 operates so that the capacitor 500 is charged by the chosen battery cell. After the sampling switch 400 has been turned off, a lower transfer switch 602 is turned on, so that the capacitor 500's ground potential falls to a grounding voltage. Sequentially, an upper transfer switch 601 is turned on, and thereby, the capacitor 500's voltage is transferred to the A/D converter 700. This helps resolve the disadvantage in that a ground capacitance may cause a voltage error.

However, in the flying capacitor circuit, as the cell-selection switch groups 200, 300 and the sampling switch 400, a photo switch which requires no drive bias is frequently used, such as a photo coupler and a photo MOS FET. In this photo switch, the grounding capacitance is small, specifically, approximately 0.5 pF, but the inter-terminal capacitance is large like 30 to 50 pF. Hence, rather than the grounding capacitance, the inter-terminal capacitance would affect the voltage error. Specifically, when the cell-selection switch groups 200, 300 and the sampling switch 400 have been turned on, the electric charge stored by the inter-terminal capacitance while being turned off moves to the capacitor 500. Thereby, a voltage error takes place in the capacitor 500.

Furthermore, as the capacitor 500, if a capacitor which has a capacitance of about 0.2 µF is used, the voltage error caused by the ground capacitance can be narrowed to such a degree that no problem could practically be raised.

Moreover, when the cell-selection switch groups 200, 300 which choose a battery cell targeted for measurement have been turned on, the transfer switch 600 is kept turned off. Hence, this switch's inter-terminal capacitance prompts the turned-on cell-selection switch groups 200, 300 to connect the battery-cell group 100 and the A/D converter 700 so that an electric current alternates. When an electric current passes between the battery cell targeted for measurement and the capacitor 500, an over-voltage caused by this battery cell's voltage is applied to the A/D converter 700. In some cases, the A/D converter 700 may be destroyed.

SUMMARY OF THE INVENTION

It is an object of the present invention to provide a voltage measurement apparatus and an electrically-driven tool which are capable of narrowing the voltage error caused by the inter-terminal capacitance of an electric switch and measuring the voltage of a battery cell more precisely. In addition, it is another object of the present invention to provide a voltage measurement apparatus and an electrically-driven tool which are capable of preventing an over-voltage from being applied to a measurement section such as an A/D converter when an electric current passes between a battery cell targeted for measurement and a capacitor.

A voltage measurement apparatus according to an aspect of the present invention which measures the voltage of a battery-cell group that is made up of a plurality of battery cells connected in series, comprising: a capacitor; a sampling switch which is formed by an electric switch, among the battery cells which make up the battery-cell group, electrically connects any one or more battery cells targeted for measurement to the capacitor so that the capacitor is charged by these battery cells targeted for measurement, and electrically separates the battery cells targeted for measurement from the capacitor after the capacitor is charged; a measurement section which measures the voltage of the capacitor after the sampling switch electrically separates the capacitor and the battery cells targeted for measurement, and acquires this voltage as a measurement voltage of the battery cells targeted for measurement; a transfer switch which is formed by an electric switch, and electrically connects the capacitor and an input terminal of the measurement section after the sampling switch electrically separates the battery cells targeted for measurement and the capacitor; and an over-voltage prevention switch which is formed by an electric switch, and grounds the input terminal of the measurement section by turning on immediately before the sampling switch electrically connects the battery cells targeted for measurement and the capacitor.

A voltage measurement apparatus according to another aspect of the present invention which measures the voltage of a battery-cell group that is made up of a plurality of battery cells connected in series, comprising: a capacitor; a sampling switch which is formed by an electric switch, among the battery cells which make up the battery-cell group, electrically connects any one or more battery cells targeted for measurement to the capacitor so that the capacitor is charged by these battery cells targeted for measurement, and electrically separates the battery cells targeted for measurement from the capacitor after the capacitor is charged; a measurement section which measures the voltage of the capacitor after the sampling switch electrically separates the capacitor and the battery cells targeted for measurement, and acquires this voltage as a measurement voltage of the battery cells targeted for measurement; and a transfer switch which is formed by an electric switch, and electrically connects the capacitor and an input terminal of the measurement section after the sampling switch electrically separates the battery cells targeted for measurement and the capacitor, wherein the measurement section: calculates a calculation measurement voltage which is the voltage of the capacitor charged by the battery cells targeted for measurement, using an equivalent circuit which indicates the inter-terminal capacitance of the sampling switch; calculates the ratio of this calculation measurement voltage to the measurement voltage; multiplies the measurement voltage by this ratio; and thereby, corrects the voltage error of the measurement voltage.

An electrically-driven tool according to another aspect of the present invention, comprising: a battery-cell group which is made up of a plurality of battery cells connected in series; a motor which is driven by electric power from the battery-cell group; an inverter section which converts DC electric power outputted from the battery-cell group into AC electric power and supplies the AC electric power to the motor; and the voltage measurement apparatus according to claim 1.

An electrically-driven tool according to another aspect of the present invention, comprising: a battery-cell group which is made up of a plurality of battery cells connected in series; a motor which is driven by electric power from the battery-cell group; an inverter section which converts DC electric power outputted from the battery-cell group into AC electric power and supplies the AC electric power to the motor; and the voltage measurement apparatus according to claim 8.

BRIEF DESCRIPTION OF THE DRAWINGS

FIG. 1 is a circuit diagram, showing the configuration of a voltage measurement apparatus according to an embodiment of the present invention.

FIG. 3 is a timing chart, showing an operation of this voltage measurement apparatus.

FIG. 4 is a timing chart, showing the effect of a diode over over-voltage protection without an over-voltage prevention switch.

FIG. 5 is a timing chart, showing the effect of an over-voltage prevention switch.

DESCRIPTION OF THE PREFERRED EMBODIMENTS

Figure 2A:
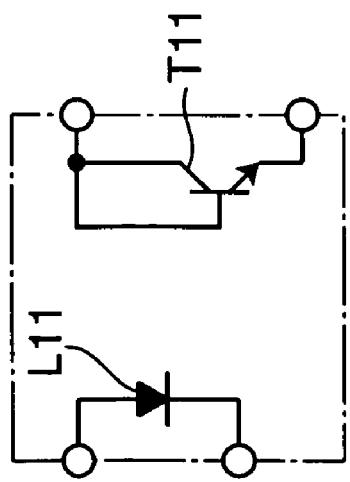
FIG. 2A is a circuit diagram, showing the configuration of a photo coupler which is an example of the sampling switch.

Hereinafter, a voltage measurement apparatus according to an embodiment of the present invention will be described with reference to the attached drawings. Incidentally, the following embodiment is an example of the one obtained by embodying the present invention, and thus, it will not limit the technical range of the present invention.

FIG. 1 is a circuit diagram, showing the configuration of the voltage measurement apparatus according to the embodiment of the present invention. This voltage measurement apparatus includes a sampling switch section 1, a capacitor 2, a transfer switch section 3, a clamp section 4, a measurement section 5, and an over-voltage prevention switch 6. It measures the voltage of any one or several battery cells 71 to 7*n* which make up a battery-cell group 7. As an example, the case where a single battery cell is measured will be described below.

The battery-cell group 7 is formed by connecting the n battery cells 71 to 7*n* in series. The battery cells 71 to 7*n* are each a chargeable secondary battery, such as a lithium-ion secondary battery, a lithium-polymer secondary battery, a nickel-hydrogen secondary battery and a nickel-cadmium secondary battery. Hereinafter, if each battery cell 71 to 7*n* is called generically, a reference numeral "70" is given to such a cell.

The sampling switch section 1 is provided with n+1 sampling switches SW1 to SWn+1, and n+1 resistors R11 to R1*n*+1. Hereinafter, if each sampling switch SW1 to SWn+1 is called generically, a reference character "SSW" is given to such a sampling switch. Besides, if each resistor R11 to R1*n*+1 is called generically, a reference character "R1" is given to such a resistor.

Among the battery cells 70 which makeup the battery-cell group 7, the positive electrodes of the battery cells 70 whose numbers are odd in numerical order from the top of FIG. 1 are connected, via first branch paths e1 whose numbers are odd in numerical order from the top of FIG. 1, to a first electrode 21 of the capacitor 2. On the other hand, the negative electrodes of the battery cells 70 whose numbers are odd in numerical order are connected, via second branch paths e2 whose numbers are even in numerical order from the top of FIG. 1, to a second electrode 22 of the capacitor 2. In contrast, among the battery cells 70 which make up the battery-cell group 7, the positive electrodes of the battery cells 70 which are even-numbered in numerical order from the top of FIG. 1 are connected, via the second branch paths e2, to the second electrode 22 of the capacitor 2. On the other hand, the negative electrodes of the corresponding battery cells 70 are connected, via the first branch paths e1, to the first electrode 21 of the capacitor 2. To each of the first branch paths e1 and the second branch paths e2, the sampling switch SSW and the resistor R1 are connected in series.

Figure 2B:
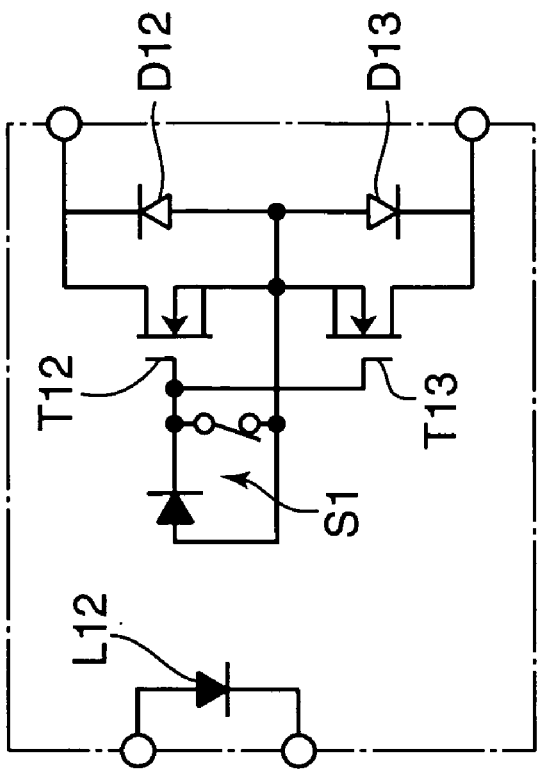
FIG. 2B is a circuit diagram, showing the configuration of a photo MOS FET which is an example of the sampling switch.

As the sampling switch SSW, a photo coupler or a photo MOS FET can be used which requires no drive bias. Each sampling switch SSW has the same configuration, and thus, the sampling switch SW1 is described as their example. FIG. 2 is circuit diagrams, each showing a detailed configuration of the sampling switch SW1. FIG. 2A is a circuit diagram, showing the configuration of a photo coupler which is an example of the sampling switch SW1. FIG. 2B is a circuit diagram, showing the configuration of a photo MOS FET which is an example of the sampling switch SW1.

As shown in FIG. 2A, the photo coupler is formed by a light-emitting diode L11 and a photo-transistor T11. The anode and the cathode of the light-emitting diode L11 are connected to the measurement section 5. In the photo-transistor T11, its collector is connected to the resistor R11 shown in FIG. 1 and its emitter is connected to the first electrode 21 of the capacitor 2. The measurement section 5 turns on electricity the light-emitting diode L11, so that the light-emitting diode L11 emits light. This light irradiates the photo-transistor T11, and thereby, the photo-transistor T11 is turned on.

As shown in FIG. 2B, the photo MOS FET is provided with a light-emitting diode L12, a photovoltaic cell S1, two field-effect transistors T12, T13, and two diodes D12, D13. The anode and the cathode of the light-emitting diode L12 are connected to the measurement section 5. The drain of the field-effect transistor T12 is connected to the resistor R11, and the drain of the field-effect transistor T13 is connected to the first electrode 21 of the capacitor 2.

The measurement section 5 turns on electricity the light-emitting diode L12, so that the light-emitting diode L12 emits light. This light irradiates the photovoltaic cell S1. Thereby, the photovoltaic cell S1 charges the gate capacities of the field-effect transistors T12, T13 and heightens the voltage between the gate and the source. Consequently, the field-effect transistors T12, T13 are turned on.

In the sampling switch section 1, any sampling switch SSW is turned on under the control of the measurement section 5. Among the battery cells 71 to 7n, a battery cell 70 targeted for measurement is connected to the capacitor 2.

The transfer switch section 3 is provided with four transfer switches SW31 to SW34 which are each formed by an FET, and three resistors R31 to R33. In the transfer switch SW31, one end is connected to the first electrode 21 of the capacitor 2 and the other end is earthed via the resistor R32. In the transfer switch SW32, one end is connected to the first electrode 21 of the capacitor 2 and the other end is connected to a resistor R41. In the transfer switch SW33, one end is connected to the electrode 22 of the capacitor 2 and the other end is connected to the resistor R41. In the transfer switch SW34, one end is connected to the second electrode 22 of the capacitor 2 and the other end is earthed via the resistor R31. The resistor R31 and the resistor R32 are connected via the resistor R33.

A description is given, by mentioning the transfer switch SW31 as an example, about what the transfer switches SW31 to SW34 are connected to. One end of the transfer switch SW31 is earthed while the other end is connected to the first electrode 21.

The clamp section 4 is provided with the resistor R41, two diodes D41, D42, and a capacitor C41. The cathode of the diode D41 is connected to a power source, and a power-source voltage VCC is applied to it. To its anode, there are connected the resistor R41, the cathode of the diode D42, the capacitor C41 and an input terminal T1 of the measurement section 5. The anode of the diode D42 is earthed. One end of the capacitor C41 is earthed. Herein, the value of the power-source voltage VCC is, for example, 5 V.

The diode D41 is a diode used for a clamp. If the voltage of the input terminal T1 exceeds the value obtained by adding the power-source voltage VCC and the forward voltage of the diode D41, then it turns on so that an electric current is sent to the power source. Thereby, the voltage of the input terminal T1 lowers, thus preventing an over-voltage from being applied to the measurement section 5.

The diode D42 is also a diode used for a clamp. If the voltage of the input terminal T1 becomes lower, by the forward voltage of the diode D42, than the grounding resistance, then it turns on so that an electric current is sent to the input terminal T1. Thereby, the voltage of the input terminal T1 is raised. The capacitor C41 cancels the high-frequency noise of the voltage applied to the input terminal T1.

The measurement section 5 is formed by: a central processing unit (or CPU) which has an analog/digital (or A/D) conversion function; a random access memory (or RAM) which is used as the working area of the CPU; a read only memory (or ROM) which stores a control program for the voltage measurement apparatus; and the like. It acquires a value obtained by executing an A/D conversion for the input terminal T1's voltage, as the measurement voltage of the battery cell 70 targeted for measurement. In addition, among the sampling switches SSW, the measurement section 5 turns on the sampling switch SSW which connects the battery cell 70 targeted for measurement to the capacitor 2. Thereby, the capacitor 2 is charged by the corresponding battery cell 70.

Furthermore, if the battery cell 70 targeted for measurement is a battery cell 70 which is odd-numbered in numerical order from the top, a positive electric charge is stored in the first electrode 21 of the capacitor 2. Therefore, the measurement section 5 turns on the transfer switch SW32 and the transfer switch SW34, so that the first electrode 21 is connected to the measurement section 5 and the second electrode 22 is connected to the earth. On the other hand, if the battery cell 70 targeted for measurement is a battery cell 70 which is even-numbered in numerical order from the top, a positive electric charge is stored in the second electrode 22 of the capacitor 2. Therefore, the measurement section 5 turns on the transfer switch SW31 and the transfer switch SW33, so that the second electrode 22 is connected to the measurement section 5 and the first electrode 21 is connected to the earth.

Moreover, the measurement section 5 measures, one by one, a measurement voltage Vx of each battery cell 71 to 7n. Then, it calculates the total voltage of the battery-cell group 7. Next, it assigns this total voltage and the measurement voltage Vx of the battery cell 70 targeted for measurement, to the following expression (1). Thereby, it calculates a calculation measurement voltage Vx' which is the measurement voltage of the battery cell 70 targeted for measurement, using an equivalent circuit which indicates the inter-terminal capacitance of the sampling switch. Then, it multiplies the ratio of the measurement voltage Vx to the calculation measurement voltage Vx' by the measurement voltage Vx $(=Vx \times (Vx/Vx'))$. Thereby, it corrects the measurement voltage Vx.

$$Vx' = (C2 \times Vx + Cssw \times \text{total battery-cell voltage} \times n)/(C2 + Cssw \times n) \quad (1)$$

Herein,

C2: the capacitor 2's capacitance

Vx: the measurement voltage of the battery cell 70 targeted for measurement

Cssw: the sampling switch SSW's inter-terminal capacitance n: connected node number Herein, if the battery cell 70 targeted for measurement is a battery cell 70 odd-numbered in numerical order and a positive electric charge is stored in the first electrode 21 of the capacitor 2, then the connected node number n is the total number of the first branch paths e1. On the other hand, if the battery cell 70 targeted for measurement is a battery cell 70 even-numbered in numerical order and a positive electric charge is stored in the second electrode 22 of the capacitor 2, then it is the total number of the second branch paths e2. Besides, the total voltage of the battery cell 70's total voltage=Σ each battery cell's measurement voltage.

The over-voltage prevention switch 6 is formed by an FET whose gate is connected to the measurement section 5, the drain is connected to the input terminal T1, and the source is earthed. Under the control of the measurement section 5, if the sampling switch SSW is turned on, it turns on immediately before the sampling switch SSW is turned on, so that the input terminal T1 is connected to the earth. Thereby, the input terminal T1's voltage is kept at the grounding voltage. This prevents an over-voltage from being generated at the input terminal T1 when the sampling switch SSW is turned on.

Next, an operation will be described of the voltage measurement apparatus. FIG. 3 is a timing chart, showing an operation of this voltage measurement apparatus. In the figure, (a) indicates timing in which the sampling switch SSW is turned on and off; (b) indicates timing in which a transfer switch is turned on and off; (c) indicates timing in which the capacitor 2 is charged and discharged; and (d) indicates timing in which the measurement section 5 executes a measurement.

In the following description, among the battery cells 70 which make up the battery-cell group 7, a case is exemplified where the voltage of the battery cell 71 is measured. Hence, the sampling switch SSW shown in (a) of FIG. 3 represents the sampling switches SW1, SW2. Besides, the sampling switches SSW other than the sampling switches SW1, SW2 are supposed to be kept turned off. In addition, in an initial state, the transfer switches SW31 to SW34 are designed to be turned off.

First, in an interval A, the measurement section 5 turns on the sampling switches SW1, SW2. Thereby, as shown in (c) of FIG. 3, the capacitor 2 is charged by the battery cell 71. When the capacitor 2 has been charged, in an interval B, the measurement section 5 turns off the sampling switches SW1, SW2, so that the capacitor 2 is disconnected from the battery cell 71. Incidentally, the time interval A is a predetermined value on the basis of the time for completing a charge which is calculated using the capacity of the battery cell 71 and a time constant defined by the capacitor 2 and the like.

In an interval C, the measurement section 5 turns on the transfer switches SW32, SW34 to measure the voltage of the capacitor 2. In an interval D, the measurement section 5 turns off both transfer switches SW32, SW34, so that the battery-cell group 7 is disconnected from the measurement section 5. In an interval E, the measurement section 5 turns on the transfer switches SW32, SW34, discharges the capacitor 2 and resets the voltage of the capacitor 2. Then, it prepares for charging the capacitor 2 using the next battery cell 70 targeted for measurement. In an interval F, the measurement section 5 turns off the transfer switches SW32, SW34 to disconnect the capacitor 2 from the measurement section 5.

In an interval G, in order to connect the next battery cell 70 targeted for measurement, for example, the battery cell 72, to the capacitor 2, the measurement section 5 turns on the sampling switches SW2, SW3. Thereby, the capacitor 2 is charged by the battery cell 72.

Herein, the effect of the diode D41 will be described. In the case where neither of the diode D41 and the over-voltage prevention switch 6 are provided, the sampling switches SSW and the transfer switches SW31 to SW34 which are connected to the battery cells 70 other than the battery cell 70 targeted for measurement are all kept turned off. However, these switches are each formed by an FET, and because of the inter-terminal capacitance of such an FET, the input terminal T1 and the battery cells 70 which are not targeted for measurement are connected so that an electric current alternates. Therefore, the moment the sampling switches SW1, SW2 have shifted from its turned-off state to the turned-on state, the battery cell 71's voltage produces an over-voltage at the input terminal T1.

FIG. 4 is a timing chart, showing the effect of the diode D41 over over-voltage protection without the over-voltage prevention switch 6. In the figure, (a) indicates timing in which the sampling switch SSW is turned on and off and (b) indicates a voltage which is applied to the input terminal T1.

In timing TM1, if the sampling switch SSW which connects the battery cell 70 targeted for measurement to the capacitor 2 is turned on, then because there is the diode D41, the input terminal T1's voltage is limited so as not to exceed the value obtained by adding the diode D41's forward voltage to the power-source voltage VCC. Therefore, when the sampling switch SSW is turned on, as shown in (b) of FIG. 4, the voltage applied to the input terminal T1 is limited to the value obtained by adding the diode D41's forward voltage to the power-source voltage VCC.

However, the forward voltage of a diode is generally approximately 0.3 to 0.6 V. Besides, the upper-limit value of a voltage which can be applied to a CPU is around the power-source voltage VCC+0.3 V, because it is affected by a parasitic diode, a transistor or the like inside of the CPU. Therefore, depending upon the height of the diode D41's forward voltage, the voltage applied to the input terminal T1 can exceed the upper-limit value which can be applied to the measurement section 5. In this case, the measurement section 5 may be damaged.

Accordingly, this voltage measurement apparatus is provided with the over-voltage prevention switch 6, so that the measurement section 5 can be prevented from being broken. FIG. 5 is a timing chart, showing the effect of the over-voltage prevention switch 6. In the figure, (a) indicates timing in which the sampling switch SSW is turned on and off so that a battery cell 70 targeted for measurement can be connected and disconnected; (b) indicates timing in which the over-voltage prevention switch 6 is turned on and off; and (c) indicates the voltage of the input terminal T1.

Hereinafter, as an example, a case will be described where the battery cell 70 targeted for measurement is the battery cell 71. In this timing chart, the sampling switches SSW other than the sampling switches SW1, SW2 corresponding to the sampling switch SSW which connect the battery cell 71 targeted for measurement, and the transfer switches SW31 to SW34, are all turned off.

In timing TM1 when the sampling switch SSW is turned on, the measurement section 5 outputs a signal for the sampling switches SW1, SW2 to turn on. At the same time, it outputs a signal for the over-voltage prevention switch 6 to turn on. Thereby, the sampling switches SW1, SW2 are both turned on. Herein, the sampling switches SW1, SW2 are each formed by a photo switch and the over-voltage prevention switch 6 is formed by an FET. Hence, because a photo MOS FET or a photo coupler operates faster than an FET, the over-voltage prevention switch 6 is already turned on when the sampling switches SW1, SW2 have been turned on.

Therefore, when the sampling switches SW1, SW2 are turned on, an electric current which flows through the input terminal T1 is drawn into the earth. As shown in (c) of FIG. 5, the input terminal T1's voltage remains at 0 V which is the grounding voltage. Consequently, such an over-voltage as shown in (b) of FIG. 4 is not applied to the input terminal T1, thus helping protect the measurement section 5 from the over-voltage.

Figure 6:
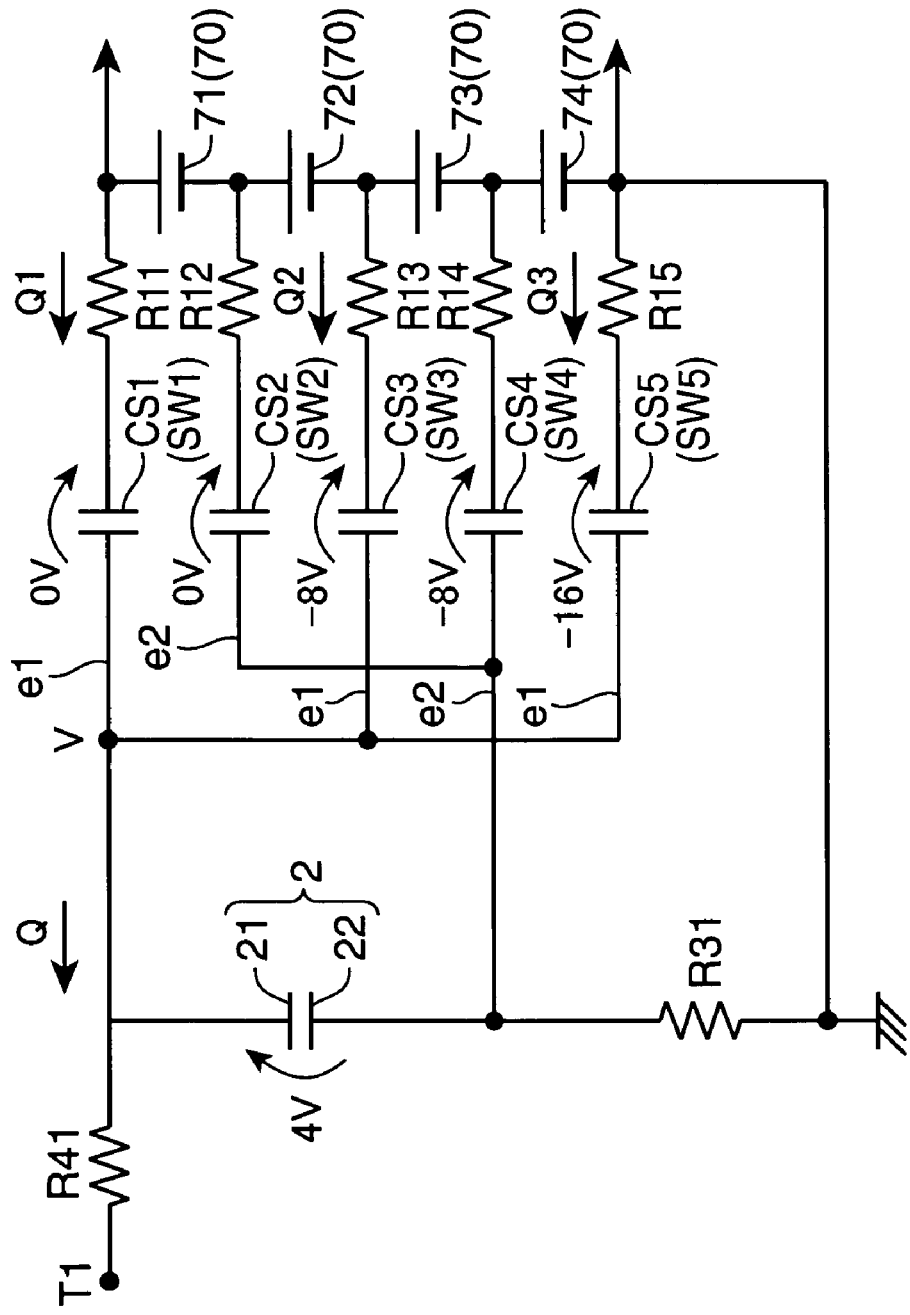
FIG. 6 is a circuit diagram, showing a voltage error caused when the voltage of a first battery cell is measured.

Next, a voltage error in a measurement voltage will be described which is caused by the inter-terminal capacitance of the sampling switch SSW. FIG. 6 is a circuit diagram, showing a voltage error caused when the voltage of the first battery cell 71 is measured.

In FIG. 6, the battery-cell group 7 is made up of four battery cells 70 which correspond to the first battery cell 71 to the forth battery cell 74. In order to make such a description simpler, the clamp section 4 and the measurement section 5 shown in FIG. 1 is omitted. Besides, as shown in FIG. 1, the first battery cell 71 is the battery cell 70 which is odd-numbered in numerical order from the top. Thus, the transfer switches SW32, SW34 are turned on when the voltage of the first battery cell 71 is measured while the transfer switches SW31, SW33 are not turned on. In FIG. 6, therefore, in the transfer switch section 3, only the resistor R31 is shown, and the other resistors R32, R33 are omitted.

Capacitors CS1 to CS5 shown in FIG. 6 indicate the inter-terminal capacitances of the sampling switches SW1 to SW5. The numeric value given to each capacitor CS1 to CS5 represents a voltage between the electrodes of each capacitor CS1 to CS5 in an electrostatic state where the sampling switches SW1 to SW5 are turned on and the capacitor 2 finishes being charged. Incidentally, each such voltage is a voltage in the case where in the capacitors CS1 to CS5, the direction from the left electrode to the right electrode is positive. For example, the capacitor CS3 is −8 V, which means that the electric potential of its right electrode is lower by 8 V than that of the left electrode.

Let's assume that the capacitance of the capacitors CS1 to CS5 is 50 pF, the capacitance of the capacitor 2 is 0.2 μF and the voltage of the first battery cell 71 to the forth battery cell 74 is 4 V. In this case, in an electrostatic state where the sampling switch SW1 is turned on and a charge to the capacitor 2 is completed, each voltage of the capacitors CS1 to CS5 becomes 0 V, 0 V, −8 V, −8 V, −16 V on the basis of the Kirchhoff's second law. Then, the voltage of the capacitor 2 becomes 4 V.

Next, when the sampling switches SW1, SW2 are shifted from their on-state to the off-state, the electric charge which moves to the capacitor 2 is assumed to be Q, the electric charges which move from the capacitors CS1, CS3, CS5 to the capacitor 2 are assumed to be Q1 to Q3, and the voltage of the first electrode 21 is assumed to be V. If the voltage between the electrodes of the capacitor 2 is expressed using the electric charge Q and the voltage V of the first electrode 21, then the following expression (2) can be obtained. At this time, the sampling switches SW3 to SW5 remain turned off throughout.

$$V=4+Q/0.2\ \mu F \quad (2)$$

Furthermore, if the voltage between the electrodes of the capacitor CS1 is expressed using the electric charge Q1 and the voltage V, the following expression (3) can be obtained. If the voltage between the electrodes of the capacitor CS3 is expressed using the electric charge Q2 and the voltage V, the following expression (4) can be obtained. If the voltage between the electrodes of the capacitor CS5 is expressed using the electric charge Q3 and the voltage V, the following expression (5) can be obtained.

$$V=16-Q1/50\ \mathrm{pF} \quad (3)$$

$$V=16-Q2/50\ \mathrm{pF} \quad (4)$$

$$V=16-Q3/50\ \mathrm{pF} \quad (5)$$

$$Q=Q1+Q2+Q3 \quad (6)$$

In addition, the above described expression (6) is satisfied based on the law of conservation of electric charge. Thus, if the voltage V is solved by assigning the above described expressions (2) to (5) to the expression (6), the following expression (7) is obtained to calculate V=4.00899 [V].

$$V=(0.8\ \mu F+50\ \mathrm{pF}\times 16\times 3)/(0.2\ \mu F+150\ \mathrm{pF}) \quad (7)$$

Therefore, in terms of the first battery cell 71, a voltage error ΔV caused by the inter-terminal capacitances of the sampling switches SW1 to SW5 is calculated so that ΔV=4.00899−4.0=8.99 [mV].

Figure 7:
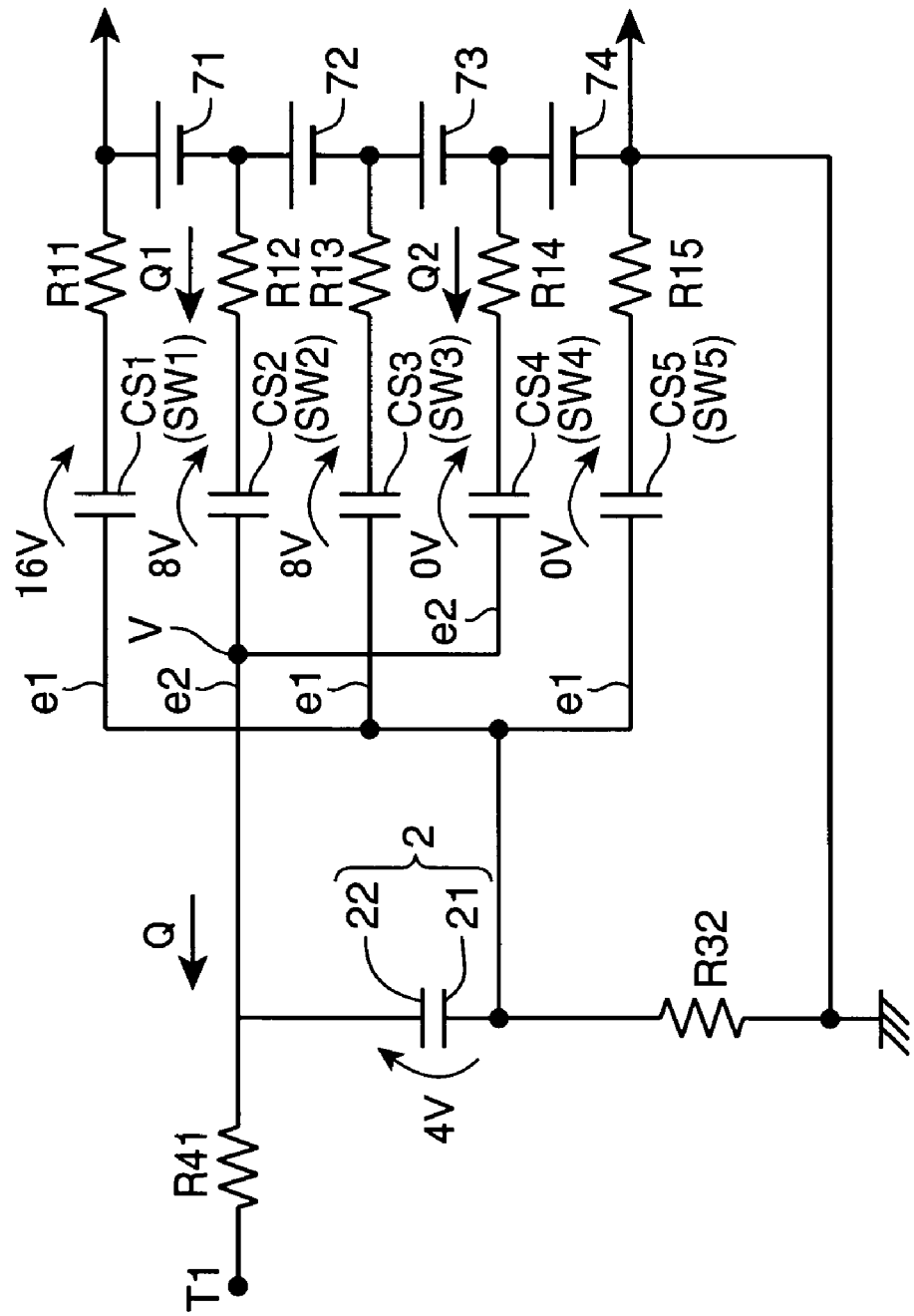
FIG. 7 is a circuit diagram, showing a voltage error caused when the voltage of a forth battery cell is measured.

FIG. 7 is a circuit diagram, showing a voltage error caused when the voltage of the forth battery cell 74 is measured. In FIG. 7, in the same way as FIG. 6, the battery-cell group 7 is made up of four battery cells 70 which correspond to the first battery cell 71 to the forth battery cell 74. In order to make such a description simpler, the clamp section 4 and the measurement section 5 shown in FIG. 1 is omitted. Besides, as shown in FIG. 1, the forth battery cell 74 is the battery cell 70 which is even-numbered in numerical order from the top. Thus, the transfer switches SW31, SW33 are turned on when the voltage of the forth battery cell 74 is measured while the transfer switches SW32, SW34 are not turned on. In FIG. 7, therefore, in the transfer switch section 3, only the resistor R32 is shown, and the other resistors R31, R33 are omitted.

The sampling switches SW4, SW5 are turned on and the sampling switches SW1 to SW3 are turned off, so that the capacitor 2 is charged. In an electrostatic state where the charge to the capacitor 2 is completed, each voltage of the capacitors CS1 to CS5 becomes 16 V, 8 V, 8 V, 0 V, 0 V on the basis of the Kirchhoff's second law. Then, the voltage of the capacitor 2 becomes 4 V.

Next, when the sampling switches SW4, SW5 are shifted from their on-state to the off-state, the electric charge which moves to the capacitor 2 is assumed to be Q, the electric charges which move from the capacitors CS2, CS4 to the capacitor 2 are assumed to be Q1, Q2, and the voltage of the second electrode 22 is assumed to be V. If the voltage between the electrodes of the capacitor 2 is expressed using the electric charge Q and the voltage V of the second electrode 22, then the following expression (8) can be obtained. At this time, the sampling switches SW1 to SW3 remain turned off throughout.

$$V=4+Q/0.2\ \mu F \quad (8)$$

Furthermore, if the voltage between the electrodes of the capacitor CS3 is expressed using the electric charge Q1 and the voltage V, the following expression (9) can be obtained. If the voltage between the electrodes of the capacitor CS3 is expressed using the electric charge Q2 and the voltage V, the following expression (10) can be obtained.

$$V=16-Q1/50\ \mathrm{pF} \quad (9)$$

$$V=16-Q2/50\ \mathrm{pF} \quad (10)$$

$$Q=Q1+Q2 \quad (11)$$

In addition, the above described expression (11) is satisfied based on the law of conservation of electric charge. Thus, if the voltage V is solved by assigning the above described expressions (8) to (10) to the expression (11), the following expression (12) is obtained to calculate V=4.00000 [V].

$$V=(0.8\ \mu F+400\ pF)/(0.2\ \mu F+100\ pF) \quad (12)$$

Therefore, in terms of the forth battery cell 74, a voltage error ΔV caused by the inter-terminal capacitances of the sampling switches SW1 to SW5 is calculated so that ΔV=0.00 [mV]. In this case, no voltage error takes place which is caused by the inter-terminal capacitances of the sampling switches SW1 to SW5.

Next, a case will be described in which the measurement section 5's arithmetic is applied to the voltage measurement circuit shown in FIG. 6. Herein, a capacitance C2 of the capacitor 2 is designed to be 0.2 μF; each charging voltage of the first battery cell 71 to the forth battery cell 74, 4.1 V; the inter-terminal capacitance of a sampling-switch group, 50 pF; and the measurement voltage Vx of the first battery cell 71, 4.109218 V. If the calculation measurement voltage Vx' is calculated using the above described expression (1), the calculation measurement voltage Vx' is given by the following expression (13). Thereby, it is calculated as Vx'=4.120495 V. Incidentally, the total voltage of the first battery cell 71 to the forth battery cell 74 is 16.409218 V.

$$Vx'=(0.2\ \mu F\times4.109218V+50\ pF\times16.409218V\times3)/(0.2\ \mu F+50\ pF\times3)=4.120495V \quad (13)$$

Therefore, the measurement voltage after corrected becomes 4.109218V×(4.109218V/4.120495V)=4.0979V. In this case, the measurement error is 4.0979−4.1=2.1 mV. On the other hand, if a correction is not made, the measurement voltage Vx becomes Vx=4.109218V. Hence, the voltage error when no correction is made is 4.109218−4.1=9.2 mV. Thus, this correction reduces the voltage error from 9.2 mV to 2.1 mV. Hence, it can be seen that the voltage of the first battery cell 71 can be more precisely calculated.

As described so far, in the voltage measurement circuit according to this embodiment, the sampling switch SSW electrically connects the battery cell 70 targeted for measurement to the capacitor 2. Then, the capacitor 2 is charged by the battery cell 70 targeted for measurement. After it has been charged, this battery cell 70 is electrically separated from the capacitor 2.

After the sampling switch SSW has electrically separated the charged capacitor 2 from the battery cell 70 targeted for measurement, the transfer switch section 3 electrically connects the capacitor 2 and the input terminal T1 of the measurement section 5. Then, the measurement section 5 measures the voltage of the charged capacitor 2. Thereby, the voltage of the battery cell 70 targeted for measurement is measured.

Herein, the sampling switch SSW is formed by a photo coupler or a photo MOS FET. When the sampling switch SSW has been shifted from its turned-on state to the turned-off state, the electric charge which corresponds to the inter-terminal capacitance of the sampling switch SSW moves to the capacitor 2. This produces a voltage error in the measurement voltage Vx. Therefore, the measurement section 5 corrects the measurement voltage Vx so that such a voltage error can be narrowed. This makes it possible to calculate the voltage of the battery cell 70 targeted for measurement more accurately.

Furthermore, the over-voltage prevention switch 6 is provided, and thus, when the sampling switch SSW electrically connects the battery cell 70 targeted for measurement and the capacitor 2, the over-voltage prevention switch 6 is turned on. Thereby, the input terminal T1 of the measurement section 5 is connected to the ground. Consequently, when the sampling switch SSW turns on, the voltage of the input terminal T1 becomes the grounding voltage. This prevents an over-voltage from being applied to the input terminal T1.

Incidentally, in the above described embodiment, a photo coupler or a photo MOS FET is used as the sampling switch SSW. However, it is not limited to this, and thus, another electric switch may also be used. In that case, the operation speed of a transistor used as the sampling switch SSW needs to be higher than the operation speed of a transistor used as the over-voltage prevention switch 6.

Moreover, an FET is used as the transfer switches SW31 to SW34, but the present invention is not limited to this. A bipolar transistor may also be used.

In addition, in the above described embodiment, a case is described where a single battery cell 70 is measured in the battery-cell group 7. However, the present invention is not limited to this, and thus, the voltages of two or more battery cells 70 may also be measured at the same time. In that case, the measurement section 5 can be designed to simultaneously turn on the sampling switch SSW which connects a battery cell 70 targeted for measurement to a capacitor.

Still further, in the voltage measurement apparatus according to this embodiment, the measurement section 5 may also have the function of correcting a measurement voltage, without the over-voltage prevention switch 6. In contrast, the voltage measurement apparatus includes the over-voltage prevention switch 6, but the measurement section 5 may not have any measurement-voltage correction function.

Figure 8:
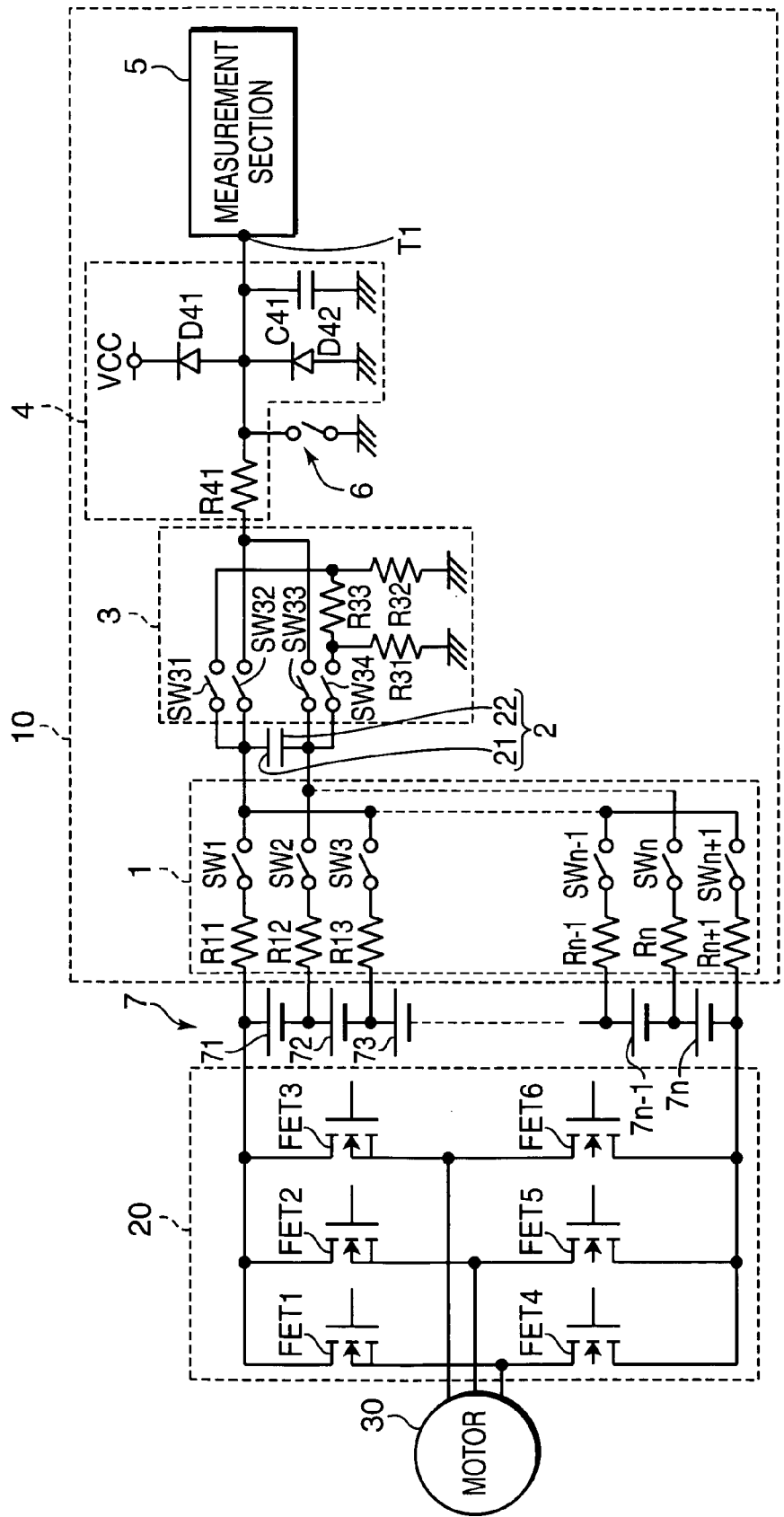
FIG. 8 is a circuit diagram, showing the configuration of an electrically-driven tool according to an embodiment of the present invention.
Figure 9:
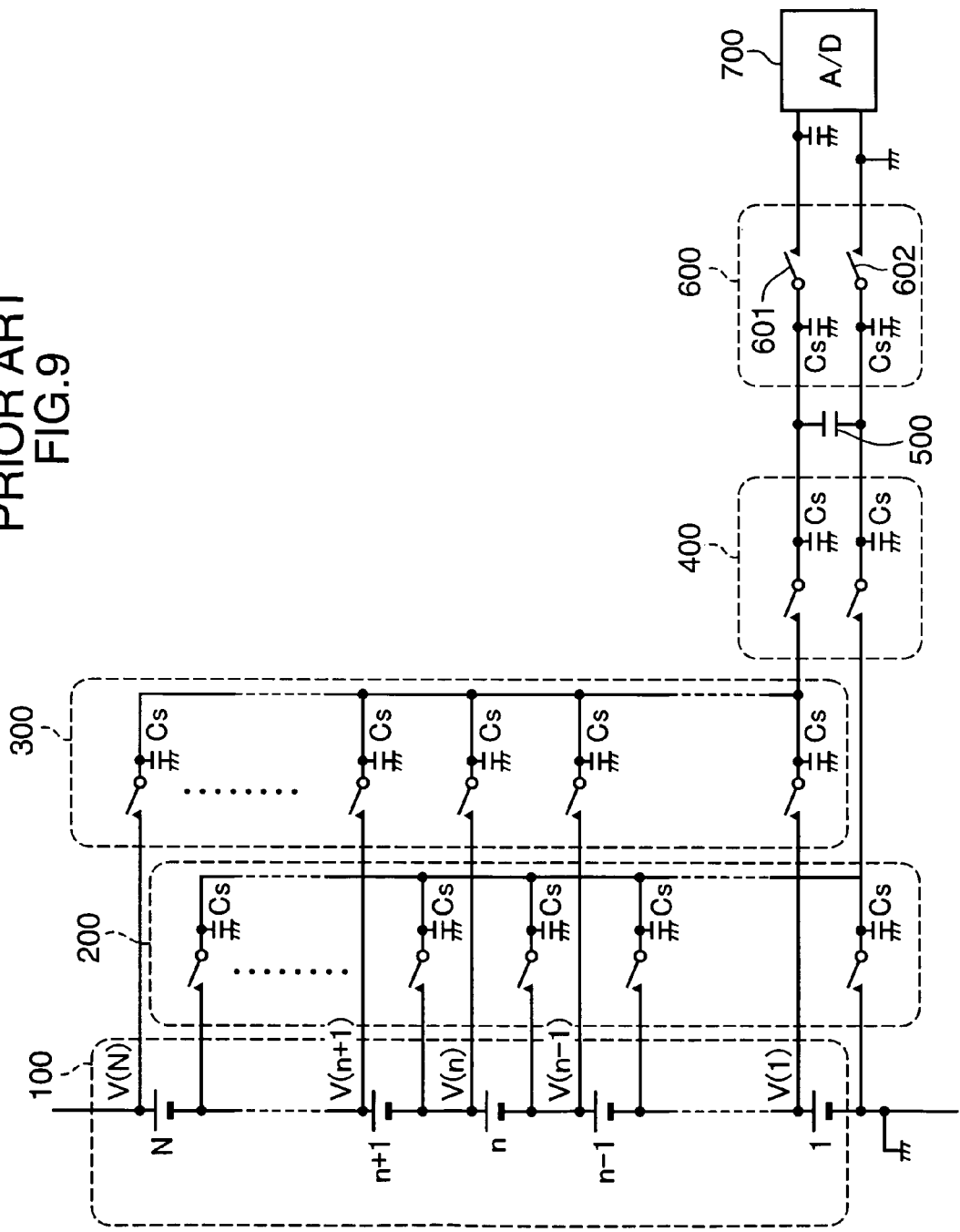
FIG. 9 is a circuit diagram, showing the configuration of a flying capacitor circuit according to a prior art.

Next, an electrically-driven tool according to an embodiment of the present invention will be described. FIG. 8 is a circuit diagram, showing the configuration of the electrically-driven tool according to the embodiment of the present invention. This electrically-driven tool includes the battery-cell group 7, a voltage measurement apparatus 10, an inverter section 20, and a motor 30. In the figure, the same reference characters and numerals are given to the component elements identical to those of FIG. 1. Then, their description is omitted. As the electrically-driven tool, there are mentioned, for example, an electric screwdriver, an electric saw, a compressor, an electrically-driven drill, and the like.

The voltage measurement apparatus 10 has the same configuration as the voltage measurement apparatus shown in FIG. 1. The inverter section 20 is a publicly-known inverter which is formed by six transistors FET1 to FET6. It converts DC electric power supplied from the battery-cell group 7 into three-phase AC electric power, so that the motor 30 can be driven. If the electrically-driven tool is, for example, an electric screwdriver, the motor 30 rotates a stick for turning a screw.

The transistors FET1 to FET6 are each formed by a n-channel field-effect transistor. The source of the transistor FET1 and the drain of the transistor FET4, the source of the transistor FET2 and the drain of the transistor FET5 and the source of the transistor FET3 and the drain of the transistor FET6 are connected to the motor 30. In the transistors FET1 to FET6, each gate is connected to the measurement section 5, so that they are turned on and off under the control of the measurement section 5.

As described so far, according to this electrically-driven tool, an electrically-driven tool can be provided which measures the voltage of the battery cell 70 precisely, without applying an over-voltage to the measurement section 5.

The above described specific embodiment mainly includes an invention which has the following configurations.

A voltage measurement apparatus according to an aspect of the present invention which measures the voltage of a battery-cell group that is made up of a plurality of battery cells connected in series, comprising: a capacitor; a sampling switch which is formed by an electric switch, among the battery cells which make up the battery-cell group, electrically connects any one or more battery cells targeted for measurement to the capacitor so that the capacitor is charged by these battery cells targeted for measurement, and electrically separates the battery cells targeted for measurement from the capacitor after the capacitor is charged; a measurement section which measures the voltage of the capacitor after the sampling switch electrically separates the capacitor and the battery cells targeted for measurement, and acquires this voltage as a measurement voltage of the battery cells targeted for measurement; a transfer switch which is formed by an electric switch, and electrically connects the capacitor and an input terminal of the measurement section after the sampling switch electrically separates the battery cells targeted for measurement and the capacitor; and an over-voltage prevention switch which is formed by an electric switch, and grounds the input terminal of the measurement section by turning on immediately before the sampling switch electrically connects the battery cells targeted for measurement and the capacitor.

According to this configuration, the sampling switch electrically connects battery cells targeted for measurement of the battery-cell group to the capacitor. Then, the capacitor is charged by these battery cells targeted for measurement. After it has been charged, the sampling switch separates the battery cells electrically from the capacitor.

After the sampling switch has electrically separated the battery cells targeted for measurement and the charged capacitor, the transfer switch electrically connects the capacitor and the input terminal of the measurement section. Then, the measurement section measures the voltage of the charged capacitor. Thereby, the voltage of the battery cells targeted for measurement, or a measurement voltage, can be obtained.

The over-voltage prevention switch turns on immediately before the sampling switch electrically connects the battery cells targeted for measurement and the capacitor. Thereby, it connects the input terminal of the measurement section to the ground. Therefore, when the sampling switch is turned on, the voltage of the input terminal becomes the grounding voltage. Hence, when the sampling switch turns on so that an electric current passes between the battery cells targeted for measurement and the capacitor, an over-voltage can be prevented from being applied to the input terminal of the measurement section.

Furthermore, in the above described voltage measurement apparatus, it is preferable that the measurement section: calculate a calculation measurement voltage which is the voltage of the capacitor charged by the battery cells targeted for measurement, using an equivalent circuit which indicates the inter-terminal capacitance of the sampling switch by a capacitor; calculate the ratio of the measurement voltage to this calculation measurement voltage; multiply the measurement voltage by this ratio; and thereby, correct the voltage error of the measurement voltage. According to this configuration, the voltage error in the measurement voltage can be narrowed which is caused by the inter-terminal capacitance of the sampling switch. This makes it possible to obtain the voltage of the battery cells targeted for measurement more accurately.

Moreover, in the above described voltage measurement apparatus, preferably: the sampling switch should be a photo coupler or a photo MOS FET; and the over-voltage prevention switch should be a transistor.

According to this configuration, the sampling switch is formed by a photo coupler or a photo MOS FET, and the over-voltage prevention switch is formed by a switch such as a transistor. Therefore, the over-voltage prevention switch operates faster than the sampling switch. Accordingly, even if the sampling switch and the over-voltage prevention switch are turned on in the same timing, the over-voltage prevention switch is already turned on when the sampling switch has been turned on. Hence, Therefore, when the sampling switch has been turned on, the input terminal of the measurement section becomes the grounding voltage. Consequently, an over-voltage which may be generated when the sampling switch is turned on can be prevented more certainly.

In addition, in the above described voltage measurement apparatus, it is preferable that: the sampling switch be disposed at a first branch path which connects the positive electrodes of the battery cells whose numbers are odd in numerical order from an end of the battery-cell group and a first electrode of the capacitor, and be disposed at a second branch path which connects the positive electrodes of the battery cells whose numbers are even in numerical order from the end of the battery-cell group and a second electrode opposite to the first electrode; and the measurement section calculate the calculation measurement voltage, using the following expression (A).

$$Vx'=(C2 \times Vx+Cssw \times \text{total battery-cell voltage} \times n)/(C2+Cssw \times n) \quad (A)$$

Herein, $Vx'$: the calculation measurement voltage $C2$: the capacitor's capacitance $Vx$: the measurement voltage of the battery cells targeted for measurement $Cssw$: the sampling switch's inter-terminal capacitance $n$: connected node number The connected node number n is the total number of the first branch paths if a positive electric charge is stored in the first electrode, and is the total number of the second branch paths if a positive electric charge is stored in the second electrode.

According to this configuration, the sampling switch is disposed at a first branch path which connects the positive electrodes of the battery cells whose numbers are odd in numerical order from an end of the battery-cell group and a first electrode of the capacitor. Simultaneously, it is disposed at a second branch path which connects the positive electrodes of the battery cells whose numbers are even in numerical order from the end of the battery-cell group and a second electrode of the capacitor.

On the basis of the measurement voltage, the capacitor's voltage obtained from the equivalent circuit which indicates the inter-terminal capacitance of the sampling switch using the measurement voltage is calculated as calculation measurement voltage. Then, the measurement voltage is multiplied by the ratio of the measurement voltage to this calculation measurement voltage, so that the measurement voltage is corrected. Therefore, the measurement voltage is precisely corrected, so that the voltage error according to the sampling switch's inter-terminal capacitance can be reduced. This makes it possible to measure the voltage of the battery cells targeted for measurement more accurately.

Furthermore, in the above described voltage measurement apparatus, preferably: the sampling switch should include a first sampling switch disposed at the first branch path, and a second sampling switch disposed at the second branch path; and the first sampling switch connected to the positive electrodes of the battery cells targeted for measurement and the second sampling switch connected to the negative electrodes of the battery cells targeted for measurement should be turned on when the measurement is taken.

According to this configuration, the sampling switch includes a first sampling switch disposed at the first branch path which connects the positive electrodes of the battery cells whose numbers are odd in numerical order from an end of the battery-cell group and a first electrode of the capacitor, and a second sampling switch disposed at the second branch path which connects the positive electrodes of the battery cells whose numbers are even in numerical order from the end of the battery-cell group and a second electrode opposite to the first electrode. Then, the first sampling switch connected to the positive electrodes of the battery cells targeted for measurement and the second sampling switch connected to the negative electrodes of the battery cells targeted for measurement is turned on when a measurement is taken. Therefore, the voltage of the battery cells targeted for measurement can be measured.

Moreover, in the above described voltage measurement apparatus, it is preferable that the transfer switch connect an electrode of the capacitor in which a positive electric charge is stored to the input terminal, and connect an electrode of the capacitor in which a negative electric charge is stored to the ground.

According to this configuration, the electrode which stores a positive electric charge of both electrodes which form the capacitor is connected to the input terminal of the measurement section. On the other hand, the electrode which stores a negative electric charge is connected to the ground terminal. Therefore, the positive electric charge is applied to the input terminal. Even if any battery cell is measured, the measurement voltage which is positive can be obtained.

In addition, in the above described voltage measurement apparatus, preferably: the transfer switch should include a first transfer switch an end of which is connected to the first electrode of the capacitor and the other end of which is grounded, a second transfer switch an end of which is connected to the first electrode of the capacitor and the other end of which is connected to the input terminal of the measurement section, a third transfer switch an end of which is connected to the second electrode of the capacitor and the other end of which is connected to the input terminal of the measurement section, and a fourth transfer switch an end of which is connected to the second electrode of the capacitor and the other end of which is grounded; if a positive electric charge is stored in the first electrode, the first transfer switch and the third transfer switch should be turned off and the second transfer switch and the fourth transfer switch should be turned on; and if a positive electric charge is stored in the second electrode, the first transfer switch and the third transfer switch should be turned on and the second transfer switch and the fourth transfer switch should be turned off.

According to this configuration, the transfer switch includes a first transfer switch an end of which is connected to the first electrode of the capacitor and the other end of which is grounded, a second transfer switch an end of which is connected to the first electrode of the capacitor and the other end of which is connected to the input terminal of the measurement section, a third transfer switch an end of which is connected to the second electrode of the capacitor and the other end of which is connected to the input terminal of the measurement section, and a fourth transfer switch an end of which is connected to the second electrode of the capacitor and the other end of which is grounded. Then, if a positive electric charge is stored in the first electrode, the first transfer switch and the third transfer switch are turned off and the second transfer switch and the fourth transfer switch are turned on. On the other hand, if a positive electric charge is stored in the second electrode, the first transfer switch and the third transfer switch are turned on and the second transfer switch and the fourth transfer switch are turned off.

Accordingly, depending upon the fact that the electric charge stored in an electrode of the capacitor is positive or negative, the connection of transfer switches is changed. Therefore, a positive electric charge is applied to the input terminal. Even if any battery cell is measured, the measurement voltage which is positive can be obtained.

A voltage measurement apparatus according to another aspect of the present invention which measures the voltage of a battery-cell group that is made up of a plurality of battery cells connected in series, comprising: a capacitor; a sampling switch which is formed by an electric switch, among the battery cells which make up the battery-cell group, electrically connects any one or more battery cells targeted for measurement to the capacitor so that the capacitor is charged by these battery cells targeted for measurement, and electrically separates the battery cells targeted for measurement from the capacitor after the capacitor is charged; a measurement section which measures the voltage of the capacitor after the sampling switch electrically separates the capacitor and the battery cells targeted for measurement, and acquires this voltage as a measurement voltage of the battery cells targeted for measurement; and a transfer switch which is formed by an electric switch, and electrically connects the capacitor and an input terminal of the measurement section after the sampling switch electrically separates the battery cells targeted for measurement and the capacitor, wherein the measurement section: calculates a calculation measurement voltage which is the voltage of the capacitor charged by the battery cells targeted for measurement, using an equivalent circuit which indicates the inter-terminal capacitance of the sampling switch; calculates the ratio of this calculation measurement voltage to the measurement voltage; multiplies the measurement voltage by this ratio; and thereby, corrects the voltage error of the measurement voltage.

According to this configuration, the sampling switch electrically connects battery cells targeted for measurement of the battery-cell group to the capacitor. Then, the capacitor is charged by these battery cells targeted for measurement. After it has been charged, the sampling switch separates the battery cells electrically from the capacitor.

After the sampling switch has electrically separated the battery cells targeted for measurement and the charged capacitor, the transfer switch electrically connects the capacitor and the input terminal of the measurement section. Then, the measurement section measures the voltage of the charged capacitor. Thereby, the voltage of the battery cells targeted for measurement can be measured.

Herein, the sampling switch is formed by an electric switch. When the sampling switch shifts from its turned-off state to the turned-on state, the electric charge stored according to the inter-terminal capacitance during the turned-off period moves to the capacitor. This produces a voltage error in the measurement voltage. However, the measurement section calculates a calculation measurement voltage which is the voltage of the capacitor charged by the battery cells targeted for measurement, using an equivalent circuit which is formed by replacing the inter-terminal capacitance of the sampling switch with a capacitor. Then, it calculates the ratio of this calculation measurement voltage to the measurement voltage and multiplies the measurement voltage by this ratio. Thereby, the voltage error caused by the inter-terminal capacitance is corrected, so that the voltage of the battery cells targeted for measurement can be precisely calculated.

Furthermore, in the above described voltage measurement apparatus, it is preferable that the sampling switch be disposed at a first branch path which connects the positive electrodes of the battery cells whose numbers are odd in numerical order from an end of the battery-cell group and a first electrode of the capacitor, and be disposed at a second branch path which connects the positive electrodes of the battery cells whose numbers are even in numerical order from the end of the battery-cell group and a second electrode opposite to the first electrode; and the measurement section calculate the calculation measurement voltage, using the following expression (A).

$$Vx' = (C2 \times Vx + Cssw \times \text{total battery-cell voltage} \times n)/(C2 + Cssw \times n) \quad (A)$$

Herein, $Vx'$: the calculation measurement voltage $C2$: the capacitor's capacitance $Vx$: the measurement voltage of the battery cells targeted for measurement $Cssw$: the sampling switch's inter-terminal capacitance $n$: connected node number The connected node number n is the total number of the first branch paths if a positive electric charge is stored in the first electrode, and is the total number of the second branch paths if a positive electric charge is stored in the second electrode.

According to this configuration, the sampling switch is disposed at a first branch path which connects the positive electrodes of the battery cells whose numbers are odd in numerical order from an end of the battery-cell group and a first electrode of the capacitor. Simultaneously, it is disposed at a second branch path which connects the positive electrodes of the battery cells whose numbers are even in numerical order from the end of the battery-cell group and a second electrode of the capacitor.

On the basis of the measurement voltage, the capacitor's voltage obtained from the equivalent circuit which indicates the inter-terminal capacitance of the sampling switch using the measurement voltage is calculated as calculation measurement voltage. Then, the measurement voltage is multiplied by the ratio of the measurement voltage to this calculation measurement voltage, so that the measurement voltage is corrected. Therefore, the measurement voltage is precisely corrected, so that the voltage error according to the sampling switch's inter-terminal capacitance can be reduced. This makes it possible to measure the voltage of the battery cells targeted for measurement more accurately.

Furthermore, in the above described voltage measurement apparatus, preferably: the sampling switch should include a first sampling switch disposed at the first branch path, and a second sampling switch disposed at the second branch path; and the first sampling switch connected to the positive electrodes of the battery cells targeted for measurement and the second sampling switch connected to the negative electrodes of the battery cells targeted for measurement should be turned on when the measurement is taken.

According to this configuration, the sampling switch includes a first sampling switch disposed at the first branch path which connects the positive electrodes of the battery cells whose numbers are odd in numerical order from an end of the battery-cell group and a first electrode of the capacitor, and a second sampling switch disposed at the second branch path which connects the positive electrodes of the battery cells whose numbers are even in numerical order from the end of the battery-cell group and a second electrode opposite to the first electrode. Then, the first sampling switch connected to the positive electrodes of the battery cells targeted for measurement and the second sampling switch connected to the negative electrodes of the battery cells targeted for measurement is turned on when a measurement is taken. Therefore, the voltage of the battery cells targeted for measurement can be measured.

Moreover, in the above described voltage measurement apparatus, it is preferable that the transfer switch connect an electrode of the capacitor in which a positive electric charge is stored to the input terminal, and connect an electrode of the capacitor in which a negative electric charge is stored to the ground.

According to this configuration, the electrode which stores a positive electric charge of both electrodes which form the capacitor is connected to the input terminal of the measurement section. On the other hand, the electrode which stores a negative electric charge is connected to the ground terminal. Therefore, the positive electric charge is applied to the input terminal. Even if any battery cell is measured, the measurement voltage which is positive can be obtained.

In addition, in the above described voltage measurement apparatus, preferably: the transfer switch should include a first transfer switch an end of which is connected to the first electrode of the capacitor and the other end of which is grounded, a second transfer switch an end of which is connected to the first electrode of the capacitor and the other end of which is connected to the input terminal of the measurement section, a third transfer switch an end of which is connected to the second electrode of the capacitor and the other end of which is connected to the input terminal of the measurement section, and a fourth transfer switch an end of which is connected to the second electrode of the capacitor and the other end of which is grounded; if a positive electric charge is stored in the first electrode, the first transfer switch and the third transfer switch should be turned off and the second transfer switch and the fourth transfer switch should be turned on; and if a positive electric charge is stored in the second electrode, the first transfer switch and the third transfer switch should be turned on and the second transfer switch and the fourth transfer switch should be turned off.

According to this configuration, the transfer switch includes a first transfer switch an end of which is connected to the first electrode of the capacitor and the other end of which is grounded, a second transfer switch an end of which is connected to the first electrode of the capacitor and the other end of which is connected to the input terminal of the measurement section, a third transfer switch an end of which is connected to the second electrode of the capacitor and the other end of which is connected to the input terminal of the measurement section, and a fourth transfer switch an end of which is connected to the second electrode of the capacitor and the other end of which is grounded. Then, if a positive electric charge is stored in the first electrode, the first transfer switch and the third transfer switch are turned off and the second transfer switch and the fourth transfer switch are turned on. On the other hand, if a positive electric charge is stored in the second electrode, the first transfer switch and the third transfer switch are turned on and the second transfer switch and the fourth transfer switch are turned off.

Accordingly, depending upon the fact that the electric charge stored in an electrode of the capacitor is positive or negative, the connection of transfer switches is changed. Therefore, a positive electric charge is applied to the input terminal. Even if any battery cell is measured, the measurement voltage which is positive can be obtained.

An electrically-driven tool according to another aspect of the present invention, comprising: a battery-cell group which is made up of a plurality of battery cells connected in series; a motor which is driven by electric power from the battery-cell group; an inverter section which converts DC electric power outputted from the battery-cell group into AC electric power and supplies the AC electric power to the motor; and the voltage measurement apparatus according to claim 1. According to this configuration, an electrically-driven tool can be provided which has the same advantage as the invention according to claim 1.

An electrically-driven tool according to another aspect of the present invention, comprising: a battery-cell group which is made up of a plurality of battery cells connected in series; a motor which is driven by electric power from the battery-cell group; an inverter section which converts DC electric power outputted from the battery-cell group into AC electric power and supplies the AC electric power to the motor; and the voltage measurement apparatus according to claim 8. According to this configuration, an electrically-driven tool can be provided which has the same advantage as the invention according to claim 8.

According to the present invention, the voltage of the battery cells which make up the battery-cell group can be precisely calculated. Besides, an over-voltage can be prevented from being generated when the sampling switch is turned on. This makes it possible to offer a voltage measurement apparatus which is useful for electrically-powered equipment such as an electrically-driven tool.

This application is based on patent application No. 2005-225736 filed in Japan, the contents of which are hereby incorporated by references.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A voltage measurement apparatus which measures the voltage of a battery-cell group that is made up of a plurality of battery cells connected in series, comprising:

a capacitor;

a sampling switch, which is formed by an electric switch, electrically connects any one or more battery cells targeted for measurement among the battery cells which make up the battery-cell group to the capacitor so that the capacitor is charged by these battery cells targeted for measurement, and electrically separates the battery cells targeted for measurement from the capacitor after the capacitor is charged;

a measurement section, which measures the actual voltage of the capacitor after the sampling switch electrically separates the capacitor and the battery cells targeted for measurement, and acquires this voltage as a measurement voltage of the battery cells targeted for measurement;

a transfer switch, which is formed by an electric switch, and electrically connects the capacitor and an input terminal of the measurement section after the sampling switch electrically separates the battery cells targeted for measurement and the capacitor; and an over-voltage prevention switch, which is formed by an electric switch, and grounds the input terminal of the measurement section by turning on immediately before the sampling switch electrically connects the battery cells targeted for measurement and the capacitor;

wherein the measurement section calculates a calculation measurement voltage, which is the hypothetical voltage of the capacitor charged by the battery cells targeted for measurement, using an equivalent circuit, which indicates the inter-terminal capacitance of the sampling switch by replacing the sampling switch with the capacitor, the calculation measurement voltage including a voltage error which occurs due to the inter-terminal capacitance in the equivalent circuit; calculates the ratio of the measurement voltage to this calculation measurement voltage; multiplies the measurement voltage by this ratio; and thereby, corrects the voltage error of the measurement voltage, and the sampling switch is disposed at a first branch path, which connects the positive electrodes of the battery cells whose numbers are odd in numerical order from an end of the battery-cell group and a first electrode of the capacitor, and is disposed at a second branch path, which connects the positive electrodes of the battery cells whose numbers are even in numerical order from the end of the battery-cell group and a second electrode opposite to the first electrode; and the measurement section calculates the calculation measurement voltage, using the following expression (A), $$Vx' = (C2 \times Vx + Cssw \times \text{total battery-cell voltage} \times n)/(C2 + Cssw \times n) \quad (A)$$

wherein:

Vx': the calculation measurement voltage;

C2: the capacitor's capacitance;

Vx: the measurement voltage of the battery cells targeted for measurement;

Cssw: the sampling switch's inter-terminal capacitance;

n: connected node number;

the connected node number n is the total number of the first branch paths if a positive electric charge is stored in the first electrode, and is the total number of the second branch paths if a positive electric charge is stored in the second electrode.

2. The voltage measurement apparatus according to claim 1, wherein:

the sampling switch is a photo coupler or a photo MOS-FET; and the over-voltage prevention switch is a transistor.

3. The voltage measurement apparatus according to claim 1, wherein:

the sampling switch includes a first sampling switch disposed at the first branch path, and a second sampling switch disposed at the second branch path; and the first sampling switch connected to the positive electrodes of the battery cells targeted for measurement and the second sampling switch connected to the negative electrodes of the battery cells targeted for measurement are turned on when the measurement is taken.

4. The voltage measurement apparatus according to claim 1, wherein the transfer switch connects an electrode of the capacitor in which a positive electric charge is stored to the input terminal, and connects an electrode of the capacitor in which a negative electric charge is stored to the ground.

5. The voltage measurement apparatus according to claim 4, wherein:

the transfer switch includes a first transfer switch an end of which is connected to the first electrode of the capacitor and the other end of which is grounded, a second transfer switch an end of which is connected to the first electrode of the capacitor and the other end of which is connected to the input terminal of the measurement section, a third transfer switch an end of which is connected to the second electrode of the capacitor and the other end of which is connected to the input terminal of the measurement section, and a fourth transfer switch an end of which is connected to the second electrode of the capacitor and the other end of which is grounded;

if a positive electric charge is stored in the first electrode, the first transfer switch and the third transfer switch are turned off and the second transfer switch and the fourth transfer switch are turned on; and if a positive electric charge is stored in the second electrode, the first transfer switch and the third transfer switch are turned on and the second transfer switch and the fourth transfer switch are turned off.

6. A voltage measurement apparatus which measures the voltage of a battery-cell group that is made up of a plurality of battery cells connected in series, comprising:

a capacitor;

a sampling switch, which is formed by an electric switch, electrically connects any one or more battery cells targeted for measurement among the battery cells which make up the battery-cell group to the capacitor so that the capacitor is charged by these battery cells targeted for measurement, and electrically separates the battery cells targeted for measurement from the capacitor after the capacitor is charged;

a measurement sections which measures the actual voltage of the capacitor after the sampling switch electrically separates the capacitor and the battery cells targeted for measurement, and acquires this voltage as a measurement voltage of the battery cells targeted for measurement; and a transfer switch, which is formed by an electric switch, and electrically connects the capacitor and an input terminal of the measurement section after the sampling switch electrically separates the battery cells targeted for measurement and the capacitor, wherein the measurement section: calculates a calculation measurement voltage which is the hypothetical voltage of the capacitor charged by the battery cells targeted for measurement, using an equivalent circuit, which indicates the inter-terminal capacitance of the sampling switch by replacing the sampling switch with the capacitor, the calculation measurement voltage including a voltage error, which occurs due to the inter-terminal capacitance in the equivalent circuit; calculates the ratio of this calculation measurement voltage to the measurement voltage; multiplies the measurement voltage by this ratio; and thereby, corrects the voltage error of the measurement voltage, the sampling switch is disposed at a first branch path, which connects the positive electrodes of the battery cells whose numbers are odd in numerical order from an end of the battery-cell group and a first electrode of the capacitor, and is disposed at a second branch path, which connects the positive electrodes of the battery cells whose numbers are even in numerical order from the end of the battery-cell group and a second electrode opposite to the first electrode; and the measurement section calculates the calculation measurement voltage, using the following expression (A);

$$Vx' = (C2 \times Vx + Cssw \times \text{total battery-cell voltage} \times n)/(C2 + Cssw \times n) \quad (A)$$

wherein:
$Vx'$: the calculation measurement voltage;
$C2$: the capacitor's capacitance;
$Vx$: the measurement voltage of the battery cells targeted for measurement;

$Cssw$: the sampling switch's inter-terminal capacitance;
$n$: connected node number;
the connected node number n is the total number of the first branch paths if a positive electric charge is stored in the first electrode, and is the total number of the second branch paths if a positive electric charge is stored in the second electrode.

7. The voltage measurement apparatus according to claim 6, wherein:

the sampling switch includes a first sampling switch disposed at the first branch path, and a second sampling switch disposed at the second branch path; and the first sampling switch connected to the positive electrodes of the battery cells targeted for measurement and the second sampling switch connected to the negative electrodes of the battery cells targeted for measurement are turned on when the measurement is taken.

8. The voltage measurement apparatus according to claim 6, wherein the transfer switch connects an electrode of the capacitor in which a positive electric charge is stored to the input terminal, and connects an electrode of the capacitor in which a negative electric charge is stored to the ground.

9. The voltage measurement apparatus according to claim 8, wherein:

the transfer switch includes a first transfer switch an end of which is connected to the first electrode of the capacitor and the other end of which is grounded, a second transfer switch an end of which is connected to the first electrode of the capacitor and the other end of which is connected to the input terminal of the measurement section, a third transfer switch an end of which is connected to the second electrode of the capacitor and the other end of which is connected to the input terminal of the measurement section, and a fourth transfer switch an end of which is connected to the second electrode of the capacitor and the other end of which is grounded;

if a positive electric charge is stored in the first electrode, the first transfer switch and the third transfer switch are turned off and the second transfer switch and the fourth transfer switch are turned on; and if a positive electric charge is stored in the second electrode, the first transfer switch and the third transfer switch are turned on and the second transfer switch and the fourth transfer switch are turned off.

10. An electrically-driven tool, comprising:

the battery-cell group according to claim 1, which is made up of a plurality of battery cells connected in series;

a motor, which is driven by electric power from the battery-cell group;

an inverter section, which converts DC electric power outputted from the battery-cell group into AC electric power and supplies the AC electric power to the motor; and the voltage measurement apparatus according to claim 1.

11. An electrically-driven tool, comprising:

the battery-cell group according to claim 6, which is made up of a plurality of battery cells connected in series;

a motor, which is driven by electric power from the battery-cell group;

an inverter section, which converts DC electric power outputted from the battery-cell group into AC electric power and supplies the AC electric power to the motor; and the voltage measurement apparatus according to claim 6.

* * * * *